United States Patent
Chen (10) Patent No.: US 11,501,841 B2
(45) Date of Patent: Nov. 15, 2022

(54) MEMORY DEVICE AND CONTROL METHOD THEREOF

(71) Applicant: MACRONIX International Co., Ltd., Hsinchu (TW)

(72) Inventor: Chung-Kuang Chen, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/169,919

(22) Filed: Feb. 8, 2021

(65) Prior Publication Data

US 2022/0254420 A1 Aug. 11, 2022

(51) Int. Cl.
*G11C 16/10* (2006.01)
*G11C 16/34* (2006.01)
*G11C 16/30* (2006.01)
*G11C 16/24* (2006.01)
*G11C 16/26* (2006.01)

(52) U.S. Cl.
CPC .......... *G11C 16/3459* (2013.01); *G11C 16/10* (2013.01); *G11C 16/24* (2013.01); *G11C 16/26* (2013.01); *G11C 16/30* (2013.01)

(58) Field of Classification Search
CPC ..... G11C 16/3459; G11C 16/10; G11C 16/24; G11C 16/26; G11C 16/30
See application file for complete search history.

(56) References Cited

U.S. PATENT DOCUMENTS

| | | | |
|---|---|---|---|
| 6,381,670 B1 * | 4/2002 | Lee | G11C 11/5628 365/104 |
| 7,529,130 B2 | 5/2009 | Toda | |
| 7,782,679 B2 | 8/2010 | Yun | |
| 8,270,215 B2 | 9/2012 | You et al. | |
| 9,159,435 B2 | 10/2015 | Yang et al. | |
| 9,263,145 B2 | 2/2016 | Arakawa | |
| 11,222,694 B1 * | 1/2022 | Bhamidipati | G11C 16/24 |
| 2002/0139999 A1 * | 10/2002 | Hirano | G11C 16/16 257/200 |
| 2017/0293446 A1 * | 10/2017 | Lo | G11C 16/10 |

OTHER PUBLICATIONS

"Office Action of Taiwan Counterpart Application", dated Mar. 22, 2022, p. 1-p. 3.

* cited by examiner

*Primary Examiner* — Xiaochun L Chen
(74) *Attorney, Agent, or Firm* — J.C. Patents (57) ABSTRACT

A memory device includes a memory cell array, a current detector and a controller. The memory cell array has a plurality of memory cell strings coupled to a common source line. The current detector detects a circulating current on the common source line or a power end of a page buffer. The controller is configured to: during a program operation, perform a first program operation on a plurality of first memory cells corresponding to logic 0 according to a first program verify voltage, and perform a second program operation on a plurality of second memory cells corresponding to logic 1 according to a second program verify voltage, where the first program verify voltage is different from the second program verify voltage; and provide a read voltage to the memory cell strings during a read operation, and sense the circulating current based on a read current reference value.

19 Claims, 6 Drawing Sheets

MEMORY DEVICE AND CONTROL METHOD THEREOF

TECHNICAL FIELD

The invention relates to a memory device and a control method thereof, and more particularly, to the memory device which can be configured to a memory device and the control method thereof.

BACKGROUND

Nowadays, when artificial intelligence is advancing day by day, it is an important issue to provide chips with high-efficiency multiplication and addition capabilities in integrated circuits. In the existing technology, it has become a mainstream to set up a memory device to perform multiplication and addition.

In the conventional technical field, it is possible to perform digital summation for all page data in a memory to generate a computation result. Such method has relatively high accuracy, but requires relatively long computing time. In addition, the conventional technical field also provides an analog method to detect a current sum on a source line to obtain a computation result. However, although this method can reduce the calculation time, it cannot provide a highly accurate computation result.

SUMMARY

The invention provides a memory device capable of improving the accuracy of current sum calculation.

The memory device of the invention includes a memory cell array, a current detector and a controller. The memory cell array has a plurality of memory cell strings. The memory cell strings are coupled to a common source line. The current detector detects a circulating current on the common source line or a power end of a page buffer. The controller is coupled to the memory cell strings, and configured to: during a program operation, perform a first program operation on a plurality of first memory cells corresponding to logic 0 according to a first program verify voltage, and perform a second program operation on a plurality of second memory cells corresponding to logic 1 according to a second program verify voltage, where the first program verify voltage is different from the second program verify voltage; and provide a read voltage to the memory cell strings during a read operation, and sense the circulating current based on a read current reference value.

The control method for the memory device includes: detecting a circulating current on the common source line or a power end of a page buffer of a memory cell array during a read operation, wherein the memory cell array having a plurality of memory cell strings, and the memory cell strings being coupled to a common source line; during a program operation, performing a first program operation on a plurality of first memory cells corresponding to logic 0 according to a first program verify voltage, and performing a second program operation on a plurality of second memory cells corresponding to logic 1 according to a second program verify voltage, wherein the first program verify voltage is different from the second program verify voltage; and providing a read voltage to the memory cell strings during the read operation, and sense the circulating current based on a read current reference value.

Based on the above, different degrees of program operations are respectively performed on the memory cells corresponding to logic 0 and logic 1 to improve distribution states of the memory cells corresponding to logic 0 and logic 1. In this way, the accuracy of the sensed circulating current provided by the memory cell array can be improved, thereby improving the accuracy of computation result.

DETAILED DESCRIPTION

Figure 1:
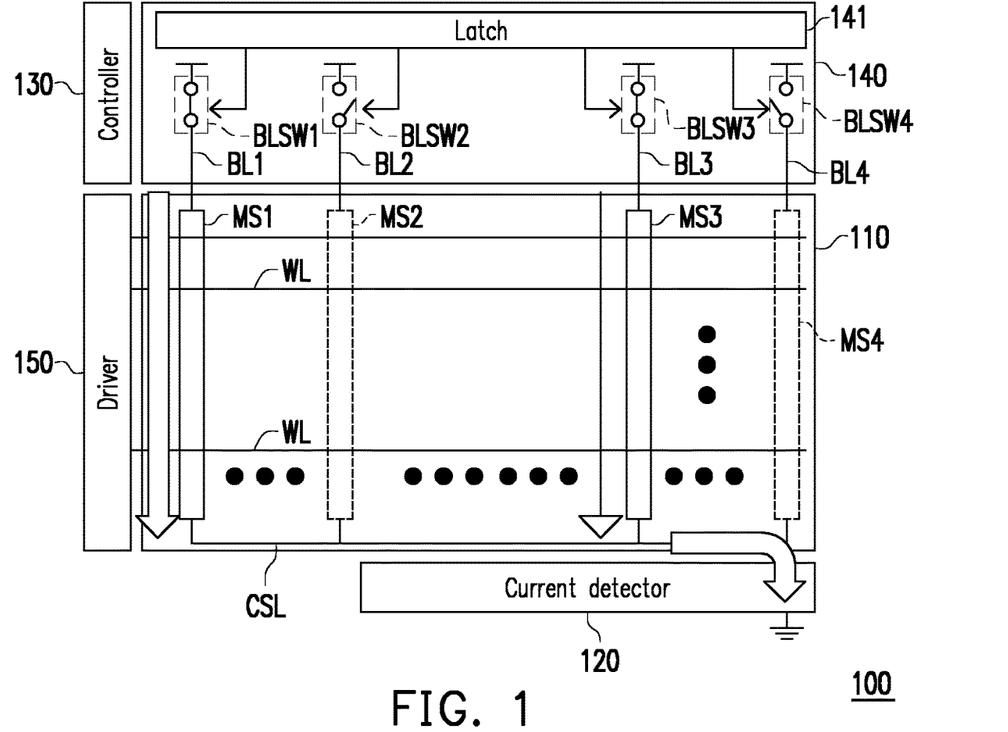
FIG. 1 is a schematic diagram illustrating a memory device in an embodiment of the invention.

Referring to FIG. 1, FIG. 1 is a schematic diagram illustrating memory device in an embodiment of the invention. A memory device 100 includes a memory cell array 110, a current detector 120, a controller 130, a page buffer 140 and a driver 150. The memory cell array 110 has a plurality of memory cell strings MS1 to MS4. The memory cell strings MS1 to MS4 may be flash memory cell strings. The memory cell strings MS1 to MS4 may be arranged in a two-dimensional arrangement. The memory cell strings MS1 to MS4 are coupled to a common source line CSL. The memory cell strings MS1 to MS4 are coupled to the driver 150 through word lines WL. The driver 150 transmits word line signals through the word lines WL to control an access operation on a plurality of memory cells on the memory cell strings MS1 to MS4. The memory cell strings MS1 to MS4 are respectively coupled to bit lines BL1 to BL4. The page buffer 140 includes a latch 141 and a plurality of bit line switches BLSW1 to BLSW4. The bit line switches BLSW1 to BLSW4 are respectively coupled to the bit lines BL1 to BL4, and controlled by a plurality of outputs of the latch 141. Based on turned-on or turned-off states, the bit line switches BLSW1 to BLSW4 respectively transmit a plurality of input signals to the bit lines BL1 to BL4. In this embodiment, the memory device 100 can be configured to be a in-memory computation device.

On the other hand, the current detector 120 is coupled to the common source line CSL, and configured to detect a circulating current on the common source line CSL during a read operation. In this embodiment, the memory cell strings MS1 to MS4 can provide weight values to be used in multiplication and addition together with the received input signals, and accordingly generate a computation result on the common source line CSL. The current detector 120 obtains the computation result by detecting the circulating current on the common source line CSL. During the read operation, the word lines of the memory cells read on the memory cell strings MS1 to MS4 can be applied with a read voltage (e.g., provided by the controller 130), and the current detector 120 can sense the circulating current on the common source line CSL based on a read current reference value (which is preset).

It should be noted that, the current detector 120 can also be coupled to a power end of the page buffer 140, and obtain the circulating current by detecting a current on the power end of the page buffer 140. In this way, the current detector 120 can also obtain the computation result generated by the memory device 100.

Figure 2:
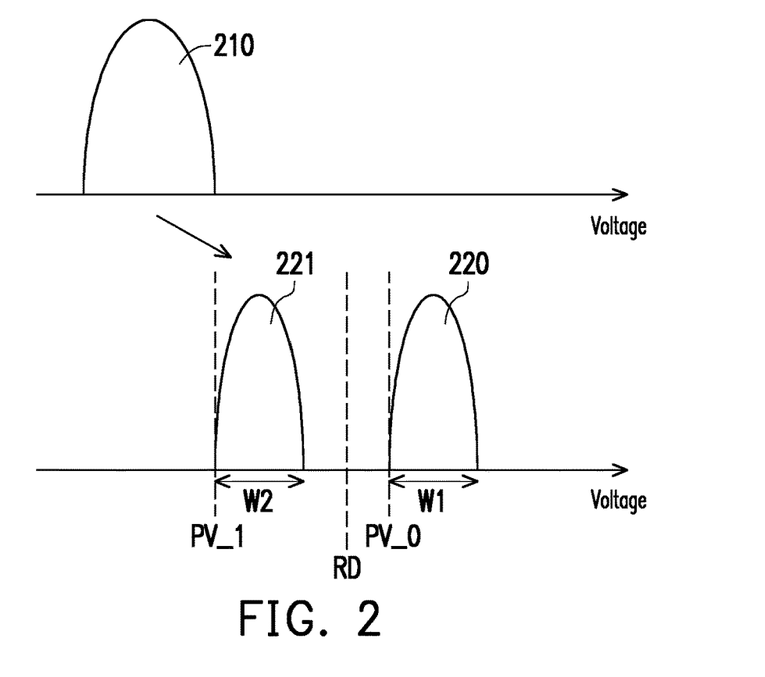
FIG. 2 is a schematic diagram illustrating distribution states of threshold voltages of memory cells in a program operation of the memory cells in an embodiment of the invention.

It should be noted that, the controller 130 is coupled to the memory cell strings MS1 to MS4. During a program operation performed on the memory cells in the memory cell strings MS1 to MS4, the controller 130 can perform a first program operation on a plurality of first memory cells corresponding to logic 0 according to a first program verify voltage, and perform a second program operation on a plurality of second memory cells corresponding to logic 1 according to a second program verify voltage. In this embodiment, the first program verify voltage is different from (i.e. larger than) the second program verify voltage. Here, referring to FIG. 1 and FIG. 2 together, FIG. 2 is a schematic diagram illustrating distribution states of threshold voltages of memory cells in a program operation of the memory cells in an embodiment of the invention. In an initial state, all memory cells are in an erased state, and have a distribution state 210. During the program operation performed on the memory cells, the controller 130 can first find out the first memory cells corresponding to logic 0 among all memory cells, and then find out the second memory cells corresponding to logic 1 among all memory cells. Next, the controller 130 performs the first program operation on the first memory cells corresponding to logic 0 according to a first program verify voltage PV_0. Then, the controller 130 performs the second program operation on the second memory cells corresponding to logic 1 according to a second program verify voltage PV_1. After the first program operation and the second program operation are completed, the first memory cells corresponding to logic 0 have a distribution state 220, and the second memory cells corresponding to logic 1 have a distribution state 221.

In this embodiment, the controller 130 may be a processor with computing capability. Alternatively, the controller 130 may be a hardware circuit designed through Hardware Description Language (HDL) or any other design methods for digital circuit well-known to persons with ordinary skill in the art and may be implemented in from of Field Programmable Gate Array (FPGA), Complex Programmable Logic Device (CPLD) or Application-specific Integrated Circuit (ASIC).

On the other hand, the current detector 120 can perform the read operation on the circulating current on the common source line CSL according to a read voltage RD.

It is noted that in the embodiments of the invention, the controller 130 applies different levels of program operations according to different program verify voltages on the first memory cells corresponding to logic 0 and the second memory cells corresponding to logic 1. In this way, after the program operations, a width W1 of the distribution state 220 of the first memory cells and a width W2 of the distribution state 221 of the second memory cells may both be set into a range. In other words, magnitudes of the currents provided by the memory cells on the memory cell string MS1 to MS4 can be effectively concentrated so that the current detector 120 can read the circulating current more accurately.

Figure 3:
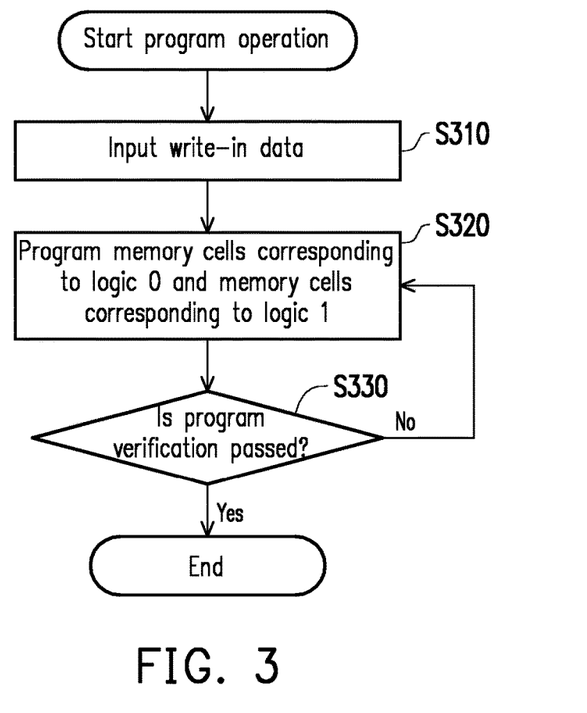
FIG. 3 is an operation flowchart illustrating the program operation performed by the memory device in an embodiment of the invention.

Referring to FIG. 3, FIG. 3 is an operation flowchart illustrating the program operation performed by the memory device in an embodiment of the invention. During the program operation performed by the memory device, the controller can input write-in data in step S310, and perform different degrees of program operations on the memory cells corresponding to logic 0 and the memory cells corresponding to logic 1 in step S320. In step S330, the controller can determine whether to continue performing step S320 according to whether a program verification is passed. If it is determined in step S330 that the program verification is not passed, step S320 is performed again; otherwise, if it is determined in step S330 that the program verification is passed, this program operation is ended.

Figure 4A:
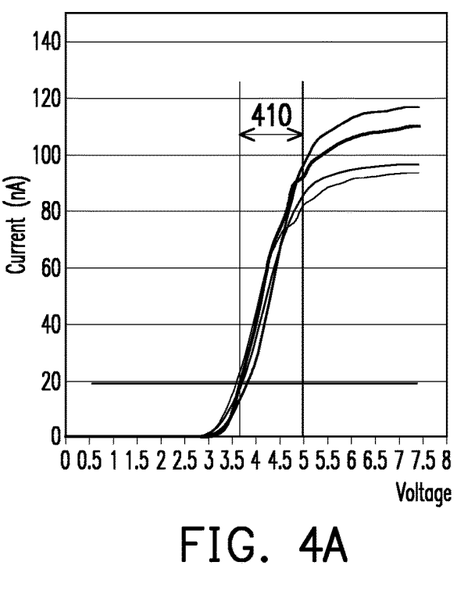
FIG. 4A and FIG. 4B illustrate current-voltage relationship diagrams of the memory cell corresponding to a program verify voltage and a read voltage in embodiments of the invention.
Figure 4B:
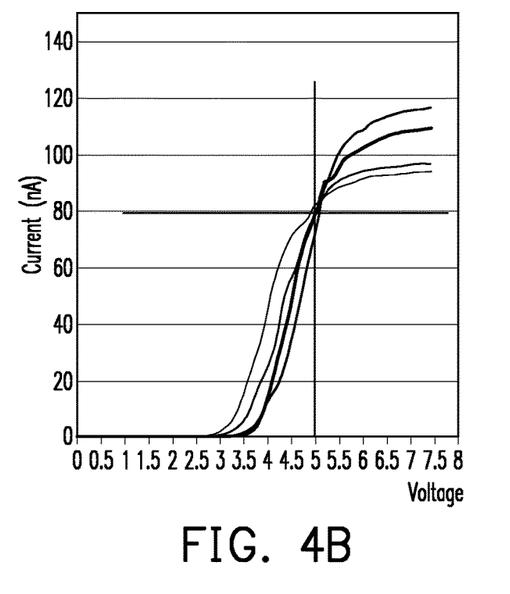

Referring to FIG. 4A and FIG. 4B, FIG. 4A and FIG. 4B illustrate current-voltage relationship diagrams of the memory cell corresponding to a program verify voltage and a read voltage in embodiments of the invention. In FIG. 4A and FIG. 4B, the horizontal axis of the curve is a bias voltage on the word lines of the memory cells, and the vertical axis of the curve is the currents generated by the memory cells. In FIG. 4A, among the memory cells corresponding to logic 1, when the provided read voltage RD is larger than the second program verify voltage PV_1, it can be found that the currents provided by the memory cells has a distribution range 410. The distribution range 410 may be, for example, between 80 nA (nanoampere) and 100 nA. This distribution range 410 will cause a certain error during a current detection operation. Based on the above, in this embodiment of the invention, the second program verify voltage PV_1 can be increased by an offset value to obtain an offset second programmed verification voltage PV1 during the program operation performed on the memory cells corresponding to logic 1, as shown in FIG. 4B. Wherein, the offset second programmed verification voltage PV1 is not larger than the read voltage RD.

In FIG. 4B, the offset second program verify voltage PV1 may be equal to the read voltage RD. In addition, the currents generated by the memory cells based on the read voltage RD may be concentrated at 80 nA, for example. Further, in the read operation, the current detector can simultaneously increase the read current reference value by an offset value (e.g., increase from 20 nA to 80 nA). In this way, the accuracy of the current detection operation performed by the current detector can be further improved.

Figure 5:
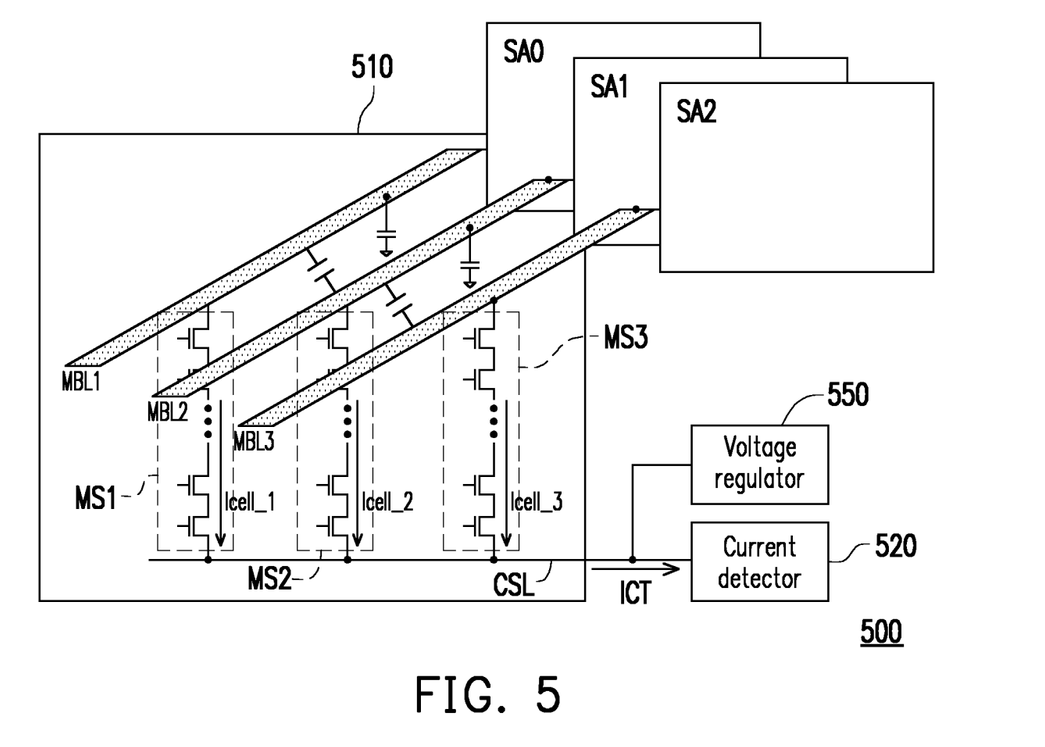
FIG. 5 is a schematic diagram illustrating memory device in another embodiment of the invention.

Referring to FIG. 5, FIG. 5 is a schematic diagram illustrating memory device in another embodiment of the invention. A memory device 500 includes a memory cell array 510, a current detector 520, a voltage regulator 550 and a plurality of sense amplifiers SA0 to SA2. The memory cell array 510 has a plurality of memory cell strings MS1 to MS3 arranged in a three-dimensional arrangement. One ends of the memory cell strings MS1 to MS3 are respectively coupled to bit lines MBL0 to MBL2; the other ends of the memory cell strings MS1 to MS3 are commonly coupled to a common source line CSL. In addition, the voltage regulator 520 and the voltage regulator 550 are both coupled to the common source line CSL.

During the read operation, the sense amplifiers SA0 to SA2 can respectively provide a plurality of bias voltages to be applied to the bit lines MBL0 to MBL2. Meanwhile, the voltage regulator 550 can provide another bias voltage to the common source line CSL. At this time, the memory cell strings MS1 to MS3 can respectively generate currents Icell_1 to Icell_3. The currents Icell_1 to Icell_3 are provided to the common source line CSL to generate a circulating current ICT. The current detector 520 can detect the circulating current ICT and obtain a current magnitude of the circulating current ICT.

In this embodiment, the memory cell strings MS1 to MS3 may be NAND flash memory cell strings.

Referring to FIG. 6A to FIG. 6D, FIG. 6A to FIG. 6D are schematic diagrams respectively illustrating implementations of voltage regulators and current detectors in memory devices in embodiments of the invention. Based on the embodiment of FIG. 5, in FIG. 6A, a voltage regulator 550-1 and a current detector 520-1 are coupled to the common source line CSL of the memory cell array 510. The voltage regulator 550-1 includes an amplifier OP1 and a transistor M1. A positive input end of the amplifier OP1 is coupled to the common source line CSL; a negative input end of the amplifier OP1 receives a reference voltage VR1; an output end of the amplifier OP1 is coupled to a control end of the transistor M11. In addition, a first end of the transistor M1 is coupled to the common source line CSL, and a second end of the transistor M1 is coupled to a reference ground end GND. The voltage regulator 550-1 can generate a source voltage VCSL according to the reference voltage VR1, and provides the source voltage VCSL to the common source line CSL. During the read operation, the circulating current ICT on the common source line CSL flows through the transistor M1. The amplifier OP1 generates a bias voltage VB at the output end according to the source voltage VCSL on the positive and negative input ends and the reference voltage VR1, and the bias voltage VB can be provided to the control end of the transistor M1.

Figure 6A:
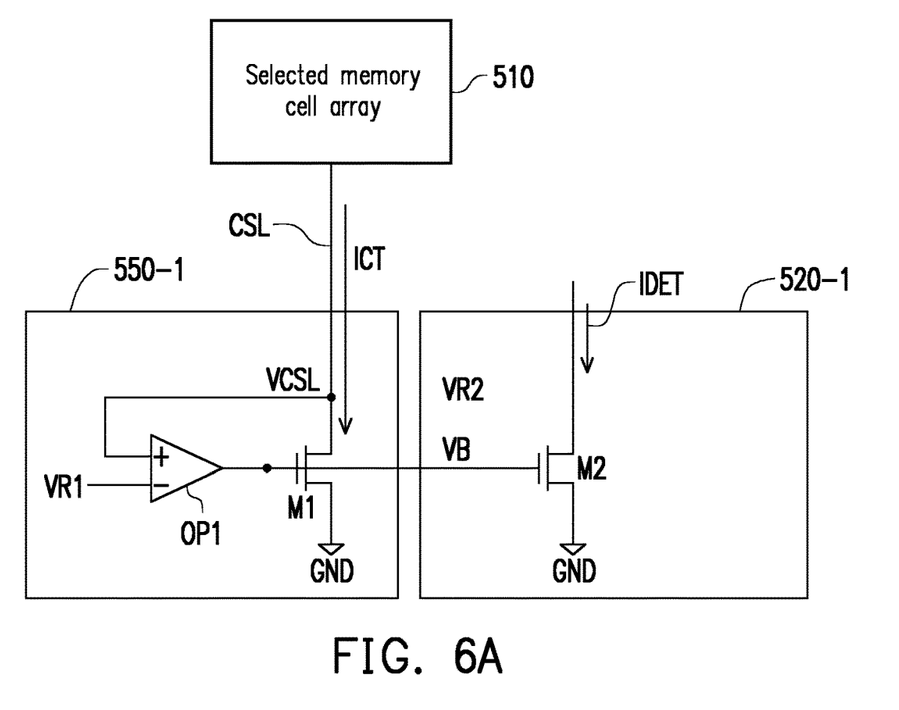
FIG. 6A to FIG. 6D are schematic diagrams respectively illustrating implementations of voltage regulators and current detectors in memory devices in embodiments of the invention.

In addition, the current detector 520-1 includes a transistor M2. A control end of the transistor M2 receives the bias voltage VB, and a second end of the transistor M2 is coupled to the reference ground end GND. The transistor M2 can mirror the circulating current ICT on the transistor M1 to generate detection information IDET at its first end. In this embodiment, by setting a channel width length ratio of the transistor M2 to 1/k times of a channel width length ratio of the transistor M1, a current value on the detection information IDET can be 1/k times of the circulating current ICT. Here, k is a real number greater than 1.

Figure 6B:
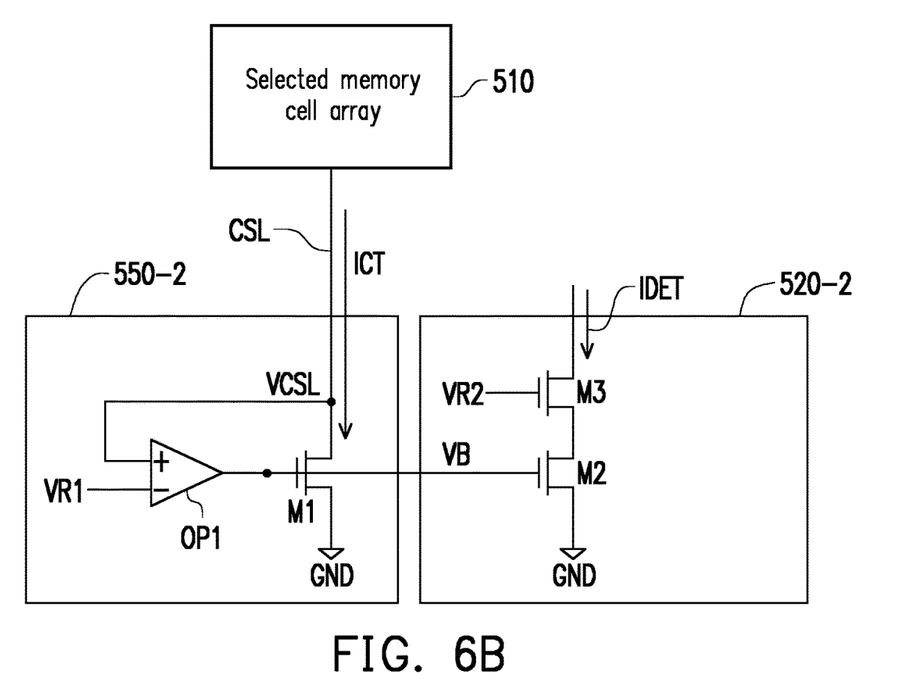

In the embodiment of FIG. 6B, a voltage regulator 550-2 and a current detector 520-2 are coupled to the common source line CSL of the memory cell array 510, and are configured to perform a detection operation on the circulating current ICT on the common source line CSL. The circuit structure of the voltage regulator 550-2 is the same as the circuit structure of the voltage regulator 550-1 in the embodiment of FIG. 6A, and will not be repeated here. Regarding the current detector 520-2, which is different from that of FIG. 6A, the current detector 520-2 further includes a transistor M3. A second end of the transistor M3 is coupled to the first end of the transistor M2; a control end of the transistor M3 receives a bias voltage VR2; and a first end of the transistor M3 generates the detection information IDET. In this embodiment, the detection information IDET may be a voltage signal or a current signal, and no more specific limitation here.

Figure 6C:
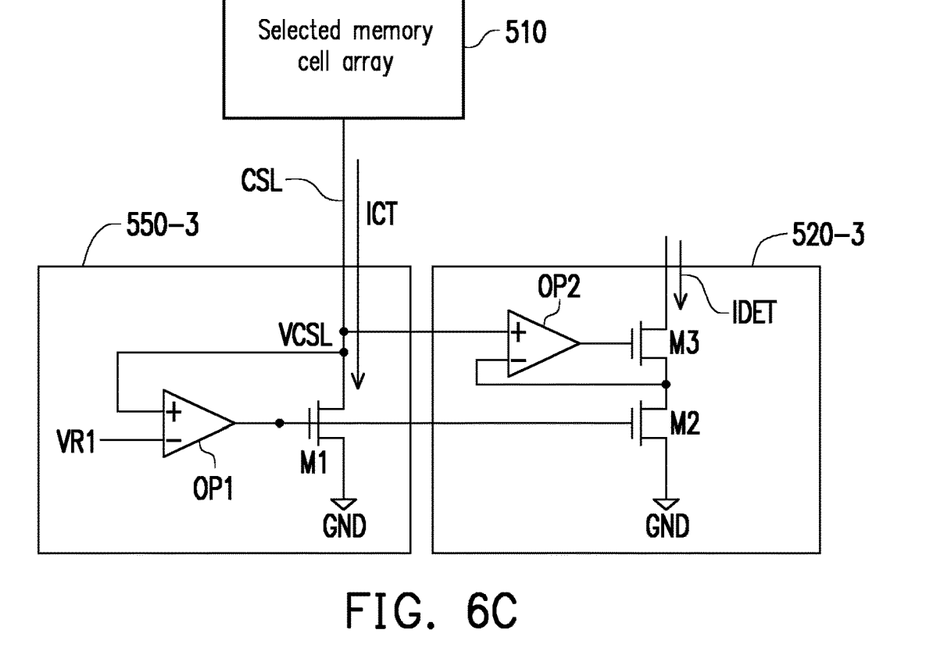

Further, in the embodiment of FIG. 6C, a voltage regulator 550-3 and a current detector 520-3 are coupled to the common source line CSL of the memory cell array 510, and are configured to perform a detection operation on the circulating current ICT on the common source line CSL. The implementation of the voltage regulator 550-3 is the same as the implementation of the voltage regulator 550-1, and will not be described in detail below. Regarding the current detector 520-3, which is different from the current detector 520-2, the current detector 520-2 in this embodiment further includes an amplifier OP2 for generating the bias voltage VR2. A positive input end of the amplifier OP2 is coupled to the common source line CSL; a negative input end of the amplifier OP2 is coupled to a coupled node of the transistors M3 and M2; and an output end of the amplifier OP2 generates the bias voltage VR.

Figure 6D:
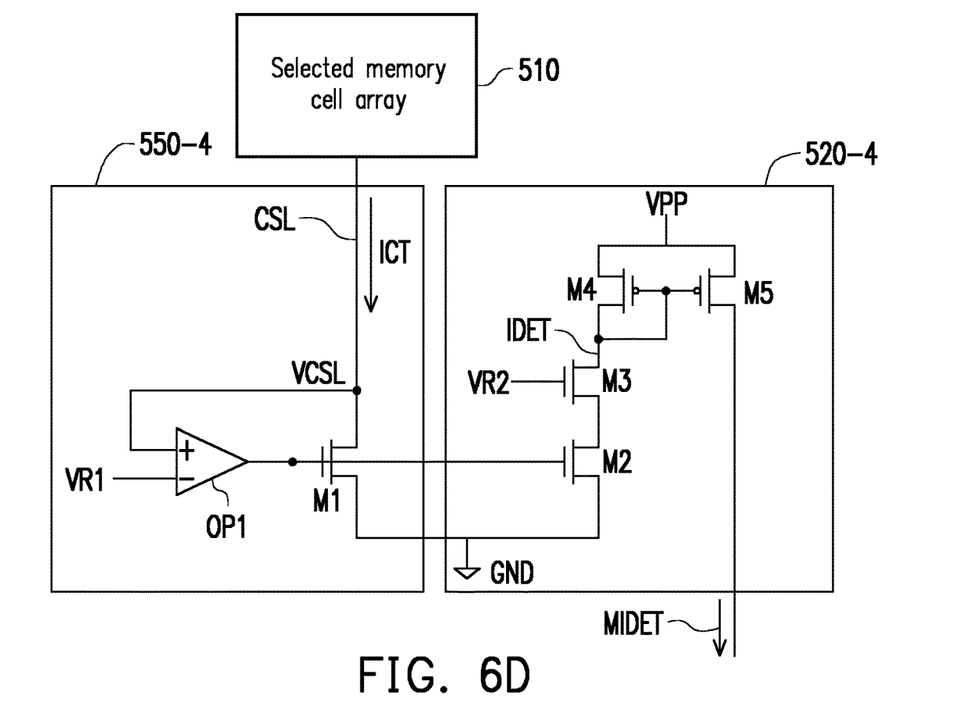

In the embodiment of FIG. 6D, a voltage regulator 550-4 and a current detector 520-4 are coupled to the common source line CSL of the memory cell array 510, and are configured to perform a detection operation on the circulating current ICT on the common source line CSL. Similarly, the implementation of the voltage regulator 550-4 is the same as the implementation of the voltage regulator 550-1, and will not be described in detail below. Regarding the current detector 520-4, which is different from the current detector 520-2, the current detector 520-4 in this embodiment further includes a current mirror composed of transistors M4 and M5. The current mirror is configured to mirror the detection information IDET provided by the transistor M3 and generate adjusted detection information MIDET. In this embodiment, the adjusted detection information MIDET may be a voltage signal or a current signal, and no more specific limitation here. In this embodiment, a current mirror ratio of the current mirror composed of the transistors M4 and M5 can be 1:1, and when the adjusted detection information MIDET is the current signal, a ratio of values of the adjusted detection information MIDET to the circulating current ICT can be 1:k.

Figure 7A:
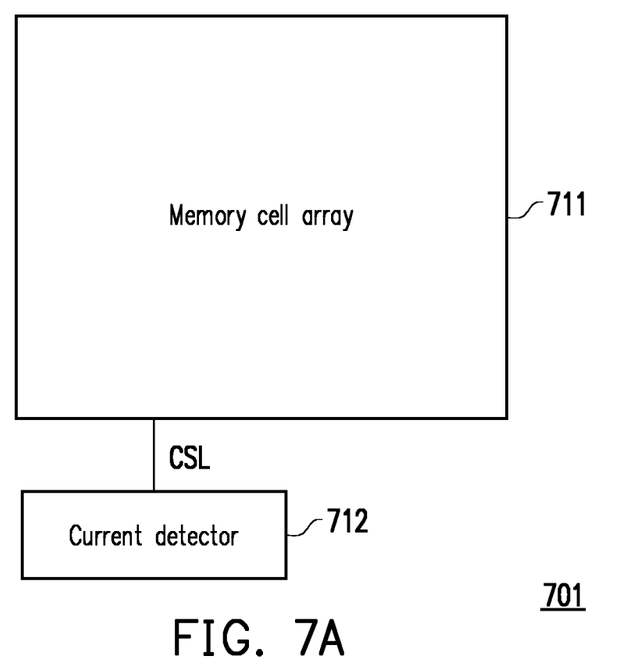
FIG. 7A and FIG. 7B are schematic diagrams respectively illustrating different implementations of memory devices in embodiments of the invention.
Figure 7B:
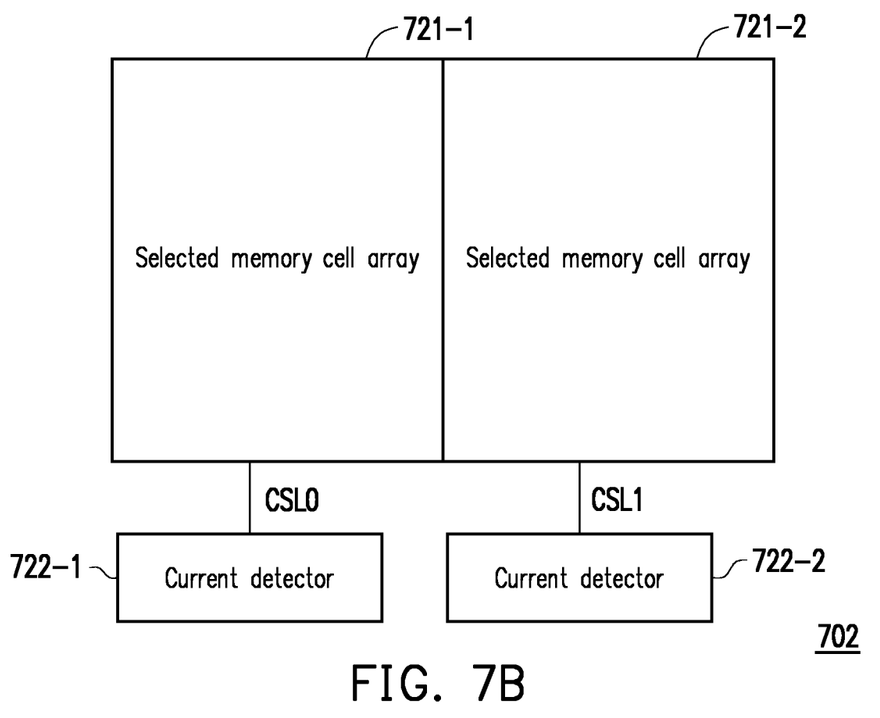

Referring to FIG. 7A and FIG. 7B, FIG. 7A and FIG. 7B are schematic diagrams respectively illustrating different implementations of memory devices in the embodiments of the invention. In FIG. 7A, in a memory device 701, a memory cell array includes all memory cell arrays 710 in a memory device. The memory cell arrays 710 include a common source line CSL. A current detector 712 is coupled to the common source line CSL of the memory cell array 710, and obtains a computation result of multiplication and addition of the memory device 701 by detecting a circulating current on the common source line CSL.

In FIG. 7B, in a memory device 702, memory cell arrays 721-1 and 721-2 are two partial memory cell arrays in a memory device. The memory cell arrays 721-1 and 721-2 respectively include common source lines CSL0 and CSL1. Current detectors 722-1 and 722-2 are respectively coupled to the common source lines CSL0 and CSL1. The current detectors 722-1 and 722-2 respectively obtain computation results respectively corresponding to the memory cell arrays 721-1 and 721-2 by detecting circulating currents on the common source lines CSL0 and CSL1.

Naturally, in the foregoing embodiments, one single memory device may include more memory cell arrays. The illustrations in FIGS. 7A and 7B are only illustrative examples, and are not intended to limit the scope of the invention.

Another embodiment provides a control method for a memory device. In this embodiment, in one step, the memory device may detect a circulating current on a common source line or a power end of a page buffer during a read operation, wherein the memory cell array has a plurality of memory strings and the memory strings are coupled to the common source line. In the other step, the memory device may, during a program operation, perform a first program operation on a plurality of first memory cells corresponding to logic 0 according to a first program verify voltage, and perform a second program operation on a plurality of second memory cells corresponding to logic 1 according to a second program verify voltage, wherein the first program verify voltage is larger than the second program verify voltage. In another step, the memory device may provide a read voltage to the memory cell strings during the read operation, and sense the circulating current based on a read current reference value.

Detail operations of the steps mentioned above have been described clearly in previous embodiments, and no more repeated descriptions here.

To sum up, the invention allows the memory cells corresponding to logic 0 and logic 1 to perform different levels of program operations, so that distribution widths of the threshold voltages of the memory cells corresponding to logic 0 and logic 1 can be limited to a certain preset value. In this way, during the read operation performed on the memory cells, a current range provided by the memory cells can have a higher uniformity, which can improve the accuracy of the read operation.

The invention claimed is:

1. A memory device, comprising:
a memory cell array having a plurality of memory cell strings, the memory cell strings being coupled to a common source line;
a current detector, coupled to the memory cell array, detecting a circulating current on the common source line or a power end of a page buffer of the memory cell array during a read operation; and
a controller, coupled to the memory cell arrays, and configured to:
during a program operation, perform a first program operation on a plurality of first memory cells corresponding to logic 0 according to a first program verify voltage, and perform a second program operation on a plurality of second memory cells corresponding to logic 1 according to a second program verify voltage, wherein the first program verify voltage is different from the second program verify voltage;
provide a first read voltage larger than the second program verify voltage to perform a plurality of first read operations to obtain a distribution range of currents of the second memory cells, and adjusts, by increasing, the second program verify voltage according to the distribution range, wherein the distribution range is between a first current value and a second current value of the second memory cells according to the plurality of first read operations; and
provide a second read voltage to the memory cell strings during a second read operation, and sense the circulating current based on a read current reference value.

2. The memory device of claim 1, wherein the first program verify voltage is larger than the second program verify voltage.

3. The memory device of claim 1, wherein the controller makes the second program verify voltage not larger than the read voltage during the second program operation.

4. The memory device according to claim 1, further comprising:
a voltage regulator, coupled to the common source line, and providing a source voltage to the common source line.

5. The memory device of claim 4, wherein the voltage regulator comprises:

a first amplifier, having a positive input end coupled to the common source line, a negative input end of the first amplifier receiving a reference voltage; and
a first transistor, having a first end coupled to an output end of the first amplifier, a control end of the first transistor being coupled to the output end of the first amplifier, a second end of the first transistor being coupled to a reference ground end.

6. The memory device of claim 5, wherein the current detector comprises:
a second transistor, having a first end generating detection information, a control end of the second transistor being coupled to the control end of the first transistor, a second end of the second transistor being coupled to reference ground end.

7. The memory device of claim 6, wherein a channel width length ratio of the second transistor is 1/k of a channel width length ratio of the first transistor, and k is a real number greater than 1.

8. The memory device of claim 6, wherein the current detector comprises:
a third transistor, having a first end generating the detection information, a second end of the third transistor being coupled to the first end of the second transistor, a control end of the third transistor receiving a bias voltage.

9. The memory device of claim 5, wherein the current detector further comprises:
a second amplifier, having a positive input end coupled to the common source line, a negative input end of the second amplifier being coupled to the second end of the third transistor, an output end of the second amplifier generating the bias voltage.

10. The memory device of claim 5, wherein the current detector further comprises:
a current mirror, coupled to the first end of the third transistor, and configured to mirror the detection information to generate adjusted detection information.

11. The memory device according to claim 1, further comprising:
a plurality of bit line switches, respectively coupled to a plurality of bit lines of the memory cell strings, respectively receiving a plurality of input signals, and respectively transmitting the input signals to the bit lines.

12. The memory device according to claim 11, further comprising:
a plurality of sense amplifiers, respectively coupled to the bit line switches.

13. The memory device of claim 1, wherein the memory cell array comprises all memory cells or partial memory cells in a memory device.

14. The memory device of claim 1, wherein the memory cell strings are arranged in a two-dimensional arrangement or a three-dimensional arrangement.

15. A control method for a memory device, comprising:
detecting a circulating current on the common source line or a power end of a page buffer of a memory cell array during a read operation, wherein the memory cell array having a plurality of memory cell strings, and the memory cell strings being coupled to a common source line;
during a program operation, performing a first program operation on a plurality of first memory cells corresponding to logic 0 according to a first program verify voltage, and performing a second program operation on a plurality of second memory cells corresponding to logic 1 according to a second program verify voltage, wherein the first program verify voltage is different from the second program verify voltage;

providing a first read voltage larger than the second program verify voltage to perform a plurality of read operations to obtain a distribution range of currents of the second memory cells, and adjusting, by increasing, the second program verify voltage according to the distribution range, wherein the distribution range is between a first current value and a second current value of the second memory cells according to the plurality of read operations; and providing a second read voltage to the memory cell strings during a second read operation, and sense the circulating current based on a read current reference value.

16. The control method of claim 15, wherein the first program verify voltage is larger than the second program verify voltage.

17. The control method of claim 15, further comprising:
making the second program verify voltage not larger than the read voltage during the second program operation.

18. The control method of claim 15, further comprising:
providing a plurality of bit line switches to respectively receive a plurality of input signals; and
providing the plurality of bit line switches to respectively transmit the input signals to the bit lines.

19. The control method of claim 15, further comprising:
selecting all or a part of memory cells of the memory device to be the memory cell array.

* * * * *